United States Patent [19]

van Berkel et al.

[11] Patent Number: 4,845,678

[45] Date of Patent: Jul. 4, 1989

[54] MEMORY COMPRISING SIMULTANEOUSLY ADDRESSABLE MEMORY ELEMENTS

[75] Inventors: Cornelis H. van Berkel; Roelof H. W. Salters, both of Eindhoven, Netherlands

[73] Assignee: U.S. Philips Corporation, New York, N.Y.

[21] Appl. No.: 33,126

[22] Filed: Mar. 31, 1987

[30] Foreign Application Priority Data

Apr. 3, 1986 [NL] Netherlands ............... 8600848

[51] Int. Cl.[4] .................. G11C 8/00; G11C 5/02
[52] U.S. Cl. .................. 365/230.06; 365/68; 365/238; 365/239; 365/238.09
[58] Field of Search ........... 365/230, 231, 221, 63, 365/68, 238, 239

[56] References Cited

U.S. PATENT DOCUMENTS

| 3,895,360 | 7/1975 | Cricchi et al. | 365/230 X |
| 4,106,109 | 8/1978 | Fassbender | 365/238 |
| 4,369,504 | 1/1983 | Hanmura | 365/238 |
| 4,434,502 | 2/1984 | Arakawa et al. | 382/41 |
| 4,725,742 | 2/1988 | Tachimori et al. | 365/231 X |
| 4,751,684 | 6/1988 | Holt | 365/231 |

FOREIGN PATENT DOCUMENTS

| 56-34179 | 4/1981 | Japan | 365/231 |
| 57-98173 | 6/1982 | Japan | 365/231 |
| 60-29855 | 2/1985 | Japan | 365/231 |
| 60-54055 | 3/1985 | Japan | |
| 0826418 | 5/1981 | U.S.S.R. | 365/231 |

OTHER PUBLICATIONS

"A Rectangular Area Filling Display System Architecture", by D. Whelan Computer Graphics, Jul. 1982, pp. 147-153, vol. 16, No. 3.

S. Demetrescu, "High Speed Rasterization Using a Highly Parallel Smart Bulk Memory", Technical Report No. 83-244, Computers Systems Laboratory, Stanford University (Jun. 1983).

Primary Examiner—Terrell W. Fears
Assistant Examiner—Alyssa H. Bowler
Attorney, Agent, or Firm—Thomas A. Briody; Jack E. Haken; Anne E. Barschall

[57] ABSTRACT

A random access memory (1) is described in which one address of a row of addresses is activatable. There is also realized a block addressing mode in which all addresses between a selectable first address and a selectable second address are activated. To this end there are provided two address registers (4, 5) and a logic tree structure (8) which consists of modules. At each level of the tree structure a module receives a part of the information from the two address registers in order to determine, possibly co-controlled by information received from a higher level of the tree, whether one or both limit addresses are situated within the address range covered by the module and, if the answer is negative, to determine whether all addresses of this address range must be activated or remain deactivated.

8 Claims, 3 Drawing Sheets

| | $X_L(i), X_H(i)$ | | | |
|---|---|---|---|---|
| | 0,0 | 0,1 | 1,0 | 1,1 |
| IR | IR/IR | IR/IR | IR/IR | IR/IR |
| OR | OR/OR | OR/OR | OR/OR | OR/OR |
| LE | LE/IR | LE/IR | OR/LE | OR/LE |
| RE | RE/OR | IR/RE | RE/OR | IR/RE |
| BE | BE/OR | LE/RE | — | OR/BE |

MEMORY COMPRISING SIMULTANEOUSLY ADDRESSABLE MEMORY ELEMENTS

BACKGROUND OF THE INVENTION

1. Field of the Invention

The invention relates to a memory comprising simultaneously addressable memory elements, notably a memory comprising an array of memory elements, which can be addressed at random in at least one coordinate direction in which the memory elements are arranged, and also comprising selection means for addressing, moreover, a series of successive memory elements together in said coordinate direction.

Using such a memory, rectangular patterns can be written into the memory in a particularly fast manner by the simultaneous addressing of all relevant memory elements. The memory can also be used in, for example a variety of graphic systems.

2. Prior Art

In an article of Daniel S. Whelan in "Computer graphics", Vol. 16, No. 3 (July 1982), pp. 147-153 a rectangular area filling display system is described.

Therein, the addressing means for the simultaneously addressable memory elements require for both the X- and Y-directions an address (LA) of a lower limit (la) and an address (UA) for an upper limit (ua) for selecting a band of outputs between and inclusive of the lower and upper limits [la, la+1, . . . ua]. The addressing means are provided with decoders for simultaneously addressing rows or columns of memory elements between and inclusive of the lower and upper limits. In a n-bit address decoder rows or columns $0, 1, \ldots 2^n - 1$ can be addressed.

The address decoders first select the rows or columns la, la+1, ... $2^n-1$, thereafter the rows or columns 0, 1, . . . ua, while finally by means of an AND operation the band [la, la+1, . . . ua] is selected.

SUMMARY OF THE INVENTION

It is an object of the invention to provide a system in which rectangular patterns having an arbitrary size can be written into a memory directly and at a high and constant speed, i.e. a speed which is independent of the size of the rectangle, by simultaneous addressing, and wherein, moreover, a modular, tree-structured logic arrangement may be conveniently implemented.

This object is achieved in accordance with the invention in that the selection means in a memory of the kind set forth comprise an input for receiving upper and lower limit information of said series, and also comprise a group of selection modules which are arranged in a tree structure, each selection module being suitable for deriving, using a part of the upper and lower limit information, further indication signals from an indication signal providing a position indication for the upper and the lower limit, said further indication signals providing a more specific position indication of the upper and the lower limit and being destined for selection modules of a nextlower level in the tree structure, the selection modules situated at the lowest level of the tree structure providing the addressing of the memory elements of said series.

Even though the selection module can in principle be constructed so that an arbitrary number of further indication signals can be derived from each indication signal for as long as the correct sub-information concerning the upper and the lower limit is applied, preferably all selection modules at a given level of the tree structure are controlled by a corresponding bit of the upper as well as the lower limit information, while from the indication signal applied to each of the selection modules at this given level there are derived two further indication signals for each time two relevant selection modules of a nextlower level or, if the given level is the lowest level of the tree structure, two addressing signals are supplied for the relevant memory elements. In a preferred embodiment of this kind the addressing time is proportional to the logarithm (base 2) of the longest feasible selectively addressable series of successive memory elements in the relevant coordinate direction. When a preferred selection module at a given level of the tree structure is combined with the relevant preferred selection modules of the nextlower level connected thereto in order to form one new selection module, the new selection module should be controlled by two corresponding bits of the upper as well as the lower limit information; thus, a selection module is obtained in which four further indication signals are derived from one indication signal. Alternatively, from one indication signal, for example three further indication signals can be derived, even though in that case the use of the supplied sub-information of the upper and the lower limit, may not be optimum.

A further embodiment of the memory in accordance with the invention can be realized by including as many selection modules in the selection means as there are required for the lowest level of the tree structure and by using each time the relevant number of selection modules required during each passage through this tree structure. Because a plurality of further indication signals are derived from each indication signal and because, moreover, these signals must be fed back to the inputs of a corresponding number of selection modules, an additional memory element should then be provided for each selection module.

The memory elements can be arranged in one coordinate direction, but usually in two coordinate directions and in exceptional cases in even more than two coordinate directions. Then, a tree structure of selection modules is provided for each coordinate direction.

In as far as the memory and the associated tree structure and control circuitry is accomodated on a single chip, such chips can be combined if a larger memory is desired, i.e. by including the group of selection modules in the form of a tree structure provided on each chip in a further tree structure for each axial direction, each selection module which is situated at a higher level in the further tree structure being accommodated on a relevant memory chip so that the further tree structure is obtained exclusively by external wiring of the individual chips.

The selection modules at the lowest level of the tree structure simultaneously supply the addressing signals for the relevant memory elements. In response thereto an indicated value "0" or "1" should be written into the memory elements between the lower limit and the upper limit; the other memory elements should retain their original value. In order to implement the foregoing in a simple manner, in accordance with the invention the individual memory elements include a gate circuit via which the addressing signals originating from the selection modules situated at the lowest level of the tree structure are supplied for the simultaneous addressing of memory elements in order to activate only the memory elements covered by the relevant series.

BRIEF DESCRIPTION OF THE FIGURES.

The invention will be described in detail hereinafter with reference to the accompanying drawings; therein.

DESCRIPTION OF THE PREFERRED EMBODIMENTS.

Figures 1, 2:
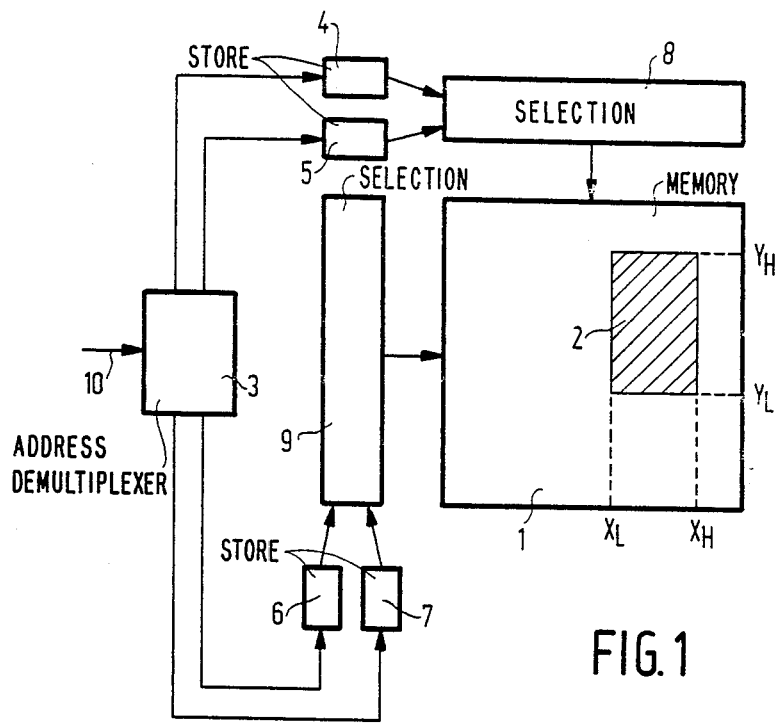
FIG. 1 is a general view of the construction of the memory in accordance with the invention for two coordinate directions.
FIG. 2 shows a truth table of a preferred selection module in order to illustrate the operation of the selection means in a preferred embodiment.

In FIG. 1, being a general view of the construction of the memory in accordance with the invention, the actual memory is denoted by the referance numeral 1. The memory is constructed as a random access memory (RAM) and consists of a matrix of memory elements which is defined in two coordinate directions X and Y. These elements consist of 1-bit memory cells in the present embodiment. The shaded area 2 of the memory 1 in FIG. 1 represents a set of memory elements which are to be simultaneously addressed, that is to say within one memory cycle, for example, for writing a corresponding area in one operation. In the X direction this set of memory elements is defined by a lower limit XL and an upper limit XH, and in the Y direction by a lower limit YL and an upper limit YH.

In addition to the customary addressing means for write and read operations in the random access memory there are also provided addressing means for simultaneously addressing the memory elements in the interval (XL, XH) and the interval (YL, YH). Only the latter addressing means are shown in FIG. 1; they are formed by an address demultiplexer 3, storing circuits 4, 5, 6 and 7, and selection means 8 and 9. The storing circuits 4 and 5 receive the values XL and XH, respectively, and the storing circuits 6 and 7 receive the values YL and YH, respectively. The upper and lower limit information applied via a line 10, that is to say the values XL, XH, YL and YH, is distributed among the registration circuits 4, 5, 6 and 7 by the address demultiplexer 3. The values XL, XH, YL and YH provide the control signals for the selection means 8 and 9. Because the procedure for the addressing of the memory elements in the interval (XL, XH) corresponds to that in the interval (YL, YH), only the addressing of the memory elements in the interval (XL, XH) will be described hereinafter, i.e. the description will be restricted to the registration means 4 and 5 and the selection means 8. This description will be given with reference to the FIGS. 2 and 3.

Figure 3:
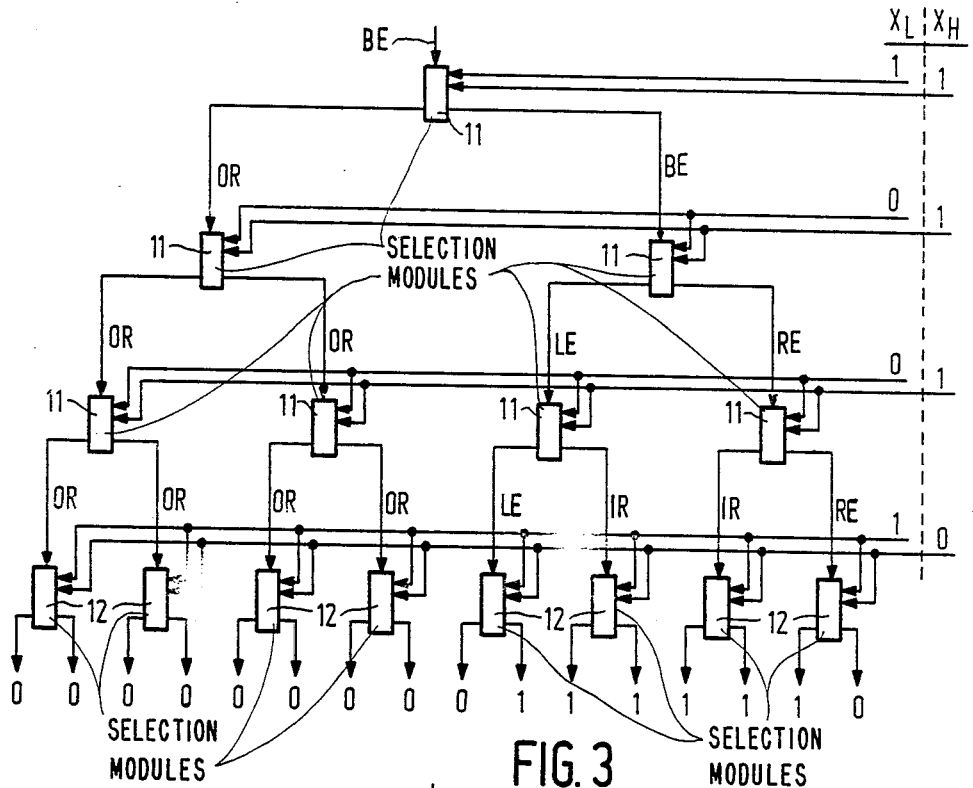
FIG. 3 shows a preferred embodiment of the selection means for addressing sixteen memory elements, which selection means are composed of the selection modules for which the truth table shown in FIG. 2 holds.

The selection means 8 shown in FIG. 3 are composed of selection modules 11 and 12 which are connected in a tree structure. In the embodiment shown, the selection means supply the addressing signals ("0" or "1") for 16 memory elements. Hereinafter a situation will be assumed in which the addressing signals for the memory elements should have the value "1" in the interval (XL, XH), while those for the memory elements outside this interval should have the value "0". The successive levels of the tree structure successively comprise 1, 2, 4 and 8 selection modules. It will be apparent that the tree structure shown can be extended to 16, 32 etc. selection modules for the addressing of 32, 64, etc. memory elements. The selection modules 12 at the lowest level of the tree structure deviate only slightly (as will be described hereinafter) from the mutually identical selection modules 11 at the higher levels of the tree structure. The selection modules at a given level are controlled by a corresponding bit of XL and XH. The most-significant bit of XL and XH controls the selection module forming the peak of the tree structure; the least-significant bit of XL and XH controls the selection modules at the lowest level of the tree structure.

One of five possible input signals, preferably in a 3-bit code, can be applied to each selection module 11, 12. These signals form indication signals which give a position indication for the upper limit and the lower limit. The following indication signals are present:

BE, which indicates that the upper limit XH as well as the lower limit XL is situated within an X sub-interval considered by a relevant selection module;

RE, which indicates that only the upper limit XH is situated within an X sub-interval considered by a relevant selection module;

LE, which indicates that only the lower limit XL is situated within an X sub-interval considered by a relevant selection module;

OR, which indicates that only addressing signals having the value "0" are situated within an X sub-interval considered by a relevant selection module, and IR, which indicates that only addressing signals having the value "1" are situated within an X sub-interval considered by a relevant selection module.

After reception of one of these indication signals, a selection module 11 supplies, in dependence of the corresponding bit of XL and XH, i.e. in dependence of the subinformation of the upper and lower limits, two further indication signals which provide a more specific position indication for the upper and lower limits. These further indication signals consist of one of the five said indication signals which, however, now relate only to an X subinterval which is only half as large as the X sub-interval associated with the indication signal applied to the relevant selection module. The further indication signals supplied by the selection modules at the lowest level of the tree structure are not formed by one of said indication signals, but by the addressing signals "0" or "1".

FIG. 2 shows a truth table for the selection modules 11; the truth table for the selection modules 12 can be simply derived therefrom as will be described hereinafter. The truth table shows the two further indication signals in dependence of one of the five indication signals to be supplied and of two corresponding bits XL(i) and XH(i) of the values XL and XH, respectively, which are stored in registration circuits 4 and 5, respectively. The truth table can be best illustrated on the basis of an actual example. For this example a total X-range is selected which extends from 0 to 15, while XL=1 0 0 1 (9) and XH=1 1 1 0 (14). The indication signal is always applied to the selection module forming the top of the tree structure. In the present example the bits 1,1 are applied to this selection module as control signals for the registration circuits. In accordance with the truth table, the further indication signals will then be OR and BE, which means that only addressing signals having the value "0" are situated within the X sub-interval (0, 7) considered by the selection module whereto the indication signal OR is applied, the upper limit (14) as well as lower limit (9) being situated within the X sub-interval (8, 15) considered by the selection module whereto the signal BE is applied. As appears from the truth table, once the indication signal OR has been supplied, the selection modules situated at lower levels of the truth structure will always supply the indication signal OR as the further indication signals, regardless of the control bits applied. The selection modules 12 then supply addressing signals having the value "0" instead of the further control signals OR. The indication signal be obtained from the selection module at the highest level of the tree structure is applied, together with the control bits 0, 1, to the relevant selection module at the highest level but one. In accordance with the truth table, this selection module supplies the further indication signals LE and RE. In other words, the lower limit (9) is situated within the X subinterval (8, 11) considered by the selection module whereto the indication signal LE is applied, the upper limit (14) being situated within the X sub-interval (12, 15) considered by the selection module whereto the indication signal RE is applied. At the highest level but two, the further indication signals LE and IR are derived from the indication signal LE and the control bits 0,1 applied, and the further indication signals IR and RE are derived from the indication signal RE and the control bits 0,1 applied. The lower limit is thus restricted to the X sub-interval (14, 15), while for the X sub-intervals (10, 11) and (12, 13) indication signals IR have been supplied. As appears from the truth table, once the indication signal IR has been supplied, the selection modules connected thereto at lower levels of the tree structure will always supply the indication signal IR as the further indication signals, regardless of the control bits supplied, though the selection modules 12 then output addressing signals having the value "1" instead of the further indication signals IR. From the indication signals LE and RE derived from the highest level but two, usually the further indication signals OR and LE, RE and OR, respectively, will be obtained after application of the control bits 1, 0. However, since the selection modules at the lowest level of the tree structure are concerned, addressing signals having the values "0" and "1", "1" and "0", respectively, are output instead. In accordance with the values chosen for XL and XH, i.e. 9 and 14, the addressing signals for the X interval (0, 8) and for the X value (15) thus obtain the value "0" and the addressing signals for the X interval (9, 14) obtain the value "1".

The addressing signals for the memory elements in the interval (YL, YH) simultaneously obtain the value "1", in the same way as the addressing signals for the memory elements in the interval (XL, XH) simultaneously obtain the value "1". The addressing signals in the X-direction can be applied to the memory elements, for example via so-called word lines (WLn), while the addressing signals in the Y-direction are then applied thereto via so-called bit selection lines (BSn).

Figure 4:
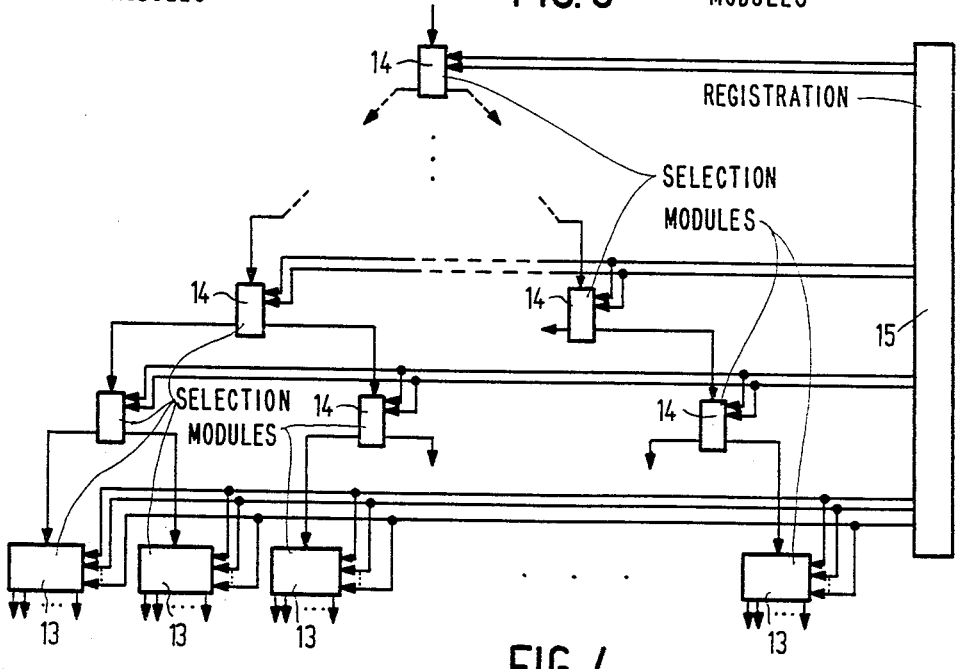
FIG. 4 shows a tree structure of memories accommodated on separate chips.

The memory with the addressing means described thus far can be accommodated on a single chip, and subsequently a plurality of chips can be combined, preferably again in a tree structure. FIG. 4 shows a tree structure for a number of groups of selection modules accommodated on separate chips; again only one coordinate direction is considered. It is assumed that one group of selection modules is accommodated on one chip and that n (n=even) addressing signals for n memory elements are obtained thereby. Such a group of selection modules comprises $\frac{1}{2}$n selection modules at the lowest level of the tree structure in which the group is arranged as shown in FIG. 3 $\frac{1}{2}$n−1 further selection modules being present at the other levels in the tree structure. Therefore, n−1 selection modules on one chip are required. The memory will preferably be composed of $2^k$ (k=2, 3, etc.) chips, so that n.$2^k$ addressing signals are obtained. These $2^k$ chips are included in a further tree structure which is composed of the same selection modules as the tree structure shown in FIG. 3. Therefore, for the further tree structure another $2^k-1$ selection modules are required.

In FIG. 4 the groups of selection modules at the lowest level of the further tree structure are denoted by the reference numeral 13 and the selection modules at the other levels of the further tree structure are denoted by the reference numeral 14. The registration circuits for the upper and the lower limit are denoted together by the reference numeral 15. Assuming a situation in which only the groups of selection modules 13 are accommodated on corresponding chips, a tree structure which is situated outside the chips will required; however, it is advantageous to distribute the addressing means between the chips so that the tree structure can be realized simply by external wiring of the individual chips. As has already been stated, $2^k-1$ selection modules are required in order to combine the $2^k$ groups of selection modules 13 so that the addressing signals for n.$2^k$ memory elements can be derived. By providing n selection modules per chip instead of the number of n−1 selection modules strictly necessary for each group, the selection modules 14 can be distributed between the groups of selection modules 13 and a tree structure can be obtained simply by external wiring of the groups of selection modules 13. One selection module will be then remain for including the further tree structure in an even more elaborate tree structure which is obtained simply by external wiring of the individual chips. This preferred composition of the tree structure does not change the number of control bits.

Figure 5:
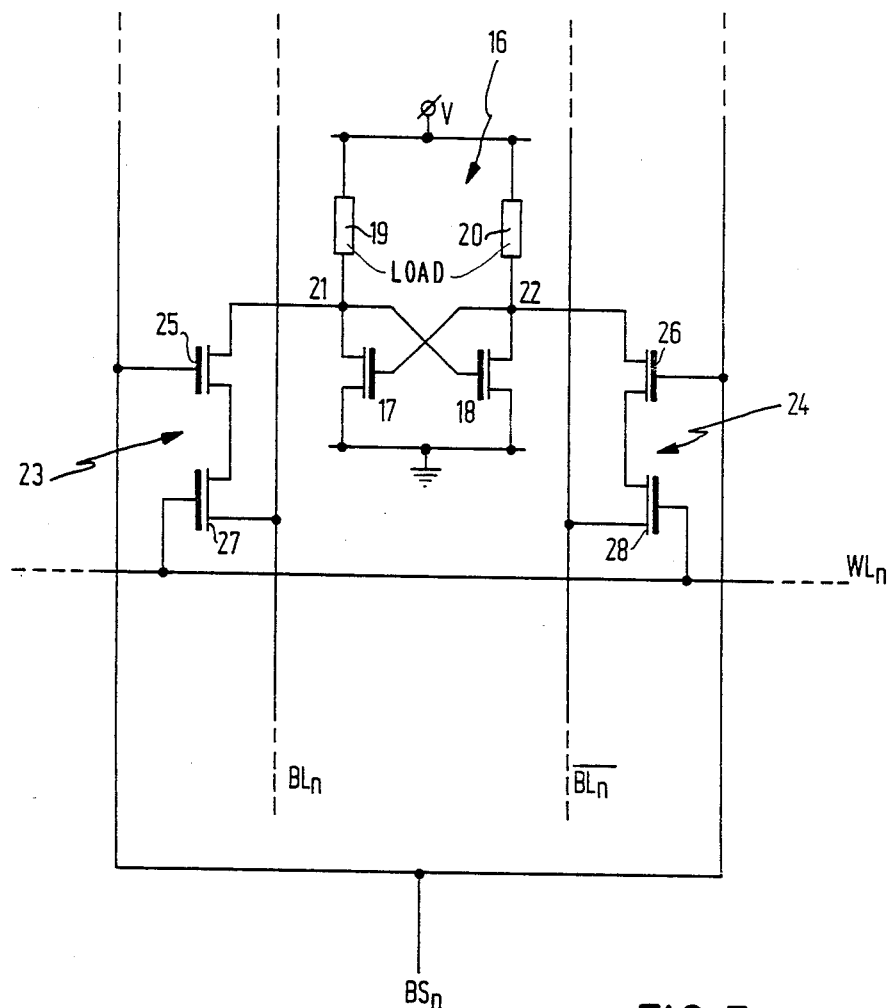
FIG. 5 shows an embodiment of a memory element in accordance with the invention which is suitable for use in a memory incorporating simultaneous addressing of the individual memory elements.

FIG. 5 shows a memory element with only the lines for the addressing signals output by the relevant selection module at the lowest level of the tree structure, i.e. the word line WLn and the bit selection line BSn, as well as the bit lines BLn and $\overline{BLn}$ via which data can be written or read.

The memory element includes in known manner a flipflop circuit 16 which is composed of two MOS transistors 17 and 18 and two load elements 19 and 20; there are also provided two gate circuits 23 and 24 which are connected to the junctions 21 and 22 and each of which is composed of two MOS transistors 25, 27 and 26, 28, respectively. The flipflop circuit is connected between ground potential 0 and the supply voltage V. The load elements 19 and 20 may be formed by depletion-type MOS transistors whose gate and source are both connected to the junctions 21, 22, respectively; these transistors remain turned on in the case of a voltage difference 0 between the two electrodes. The other transistors of the circuit shown in FIG. 5 are of the enhancement type and are turned off when the voltage difference between the source and the gate becomes 0.

Write and read opertaions in the memory element can in principle take place only when WLn=1 as well as BSn=1, because it is only in that case that the two transistors of the gate circuits 23 and 24 are enabled for being turned on. Depending on the state of the flipflop circuit, either the series connection of the transistors 17, 25, and 27 will be turned on or the series connection of the transistors 18, 26 and 28. If WLn=0 and/or BSn=0, the connection between the actual memory element formed by the flipflop circuit and the write/read lines BLn, $\overline{BLn}$ is cut off. Write operations should also be performed by setting the word line to "1" and the two bit lines to "0", one of the bit selection lines (which, of course may no longer be interconnected in that case) is made "1" and the other "0".

Finally, it is to be noted that masking circuits can be arranged between the selection means 8 and/or 9 and the memory 1 in order to invert a part of the addressing signals within the rectangle defined by the upper limit and lower limits, so that the latter addressing signals obtain the same value as the addressing signals for the memory elements situated outside the rectangle. Such a masking circuit can be used, for example for describing the circumference of the rectangle, i.e. by inverting only the addressing signals between the lower limit and the upper limit in one axial direction during a first cycle and by inverting only the addressing signals between the lower limit and the upper limit in the other axial direction during a second cycle.

What is claimed is:

1. A memory comprising:
   a. an array of memory elements (1), defining at least one coordinate direction, which elements are simultaneously addressable at random in subarrays defined by at least one respective range of addresses along the at least one coordinate direciton;
   b. at least one selection means (8,9) for addressing a subarray (2) defined by at least one respective desired range of addresses in at least one respective one of the at least one coordinate direction, each selection means comprising:
      i. respective input means for receiving respective upper ($X_H, Y_H$) and lower ($X_L, Y_L$) limit information defining said respective desired range;
      ii. a respective plurality of similary-operating selection modules (11,12), arranged as nodes connecting branches in a vertical tree structure having a plurality of levels, each module being responsive to a part of said upper and lower limit information, each module corresponding to a respective module range of addresses, with the respective module range of addresses being smaller for modules at lower levels of the tree and having:
         A. a respective input for receiving an indication signal (BE, LE, RE, OR, IR) which provides a position indication for indicating a position of the part of the upper and lower limit information with respect to the respective module range of addresses, and
         B. a respective output means for supplying further indication signals such that in the modules at a lowest level of the tree structure the further indication signals are addressing signals for the memory elements in the subarray, and in the modules not at the lowest level of the tree structure the further indication signals are more specific position information for modules therebelow;

whereby, granularity of selection of the memory elements is arbitrarily low.

2. The memory of claim 1 wherein
   a. each upper and lower limit information comprises respective first and second bit sequences;
   b. each of the modules comprises a respective second input means for receiving one bit from the respective first bit sequence and a corresponding bit from the respective second bit sequence;
   c. each of the modules not at the lowest level supplies two further indication signals to two respective selection modules at a lower level; and
   d. each of the modules at the lowest level supplies two addressing signals to relevant ones of the memory elements.

3. The memory of claim 2 wherein
   a. the array of memory elements defines and is addressable in first and second coordinate directions; and
   b. there are first and second selection means for addressing a subarray which is defined by first and second respective first and second desired ranges of memory elements in the first and second coordinate directions and the respective input means of each selection means is for receiving respective upper and lower limit information for a respective one of the first and second desired ranges.

4. The memory of claim 1 wherein
   a. the array of memory elements defines and is addressable in first and second coordinate directions; and
   b. there are first and second selection means for addressing a subarray which is defined by first and second respective first and second desired ranges of memory elements in the first and second coordinate directions and the respective input means of each selection means is for receiving respective upper and lower limit information for a respective one of the first and second desired ranges.

5. The memory of claim 1 wherein each memory element comprises means for simultaneously gating the addressing signals from the lowest level of the tree structure to the memory elements, so that only the memory elements covered by a relevant desired range are activated.

6. The memory of claim 1 wherein all of the selection modules not on the lowest level are identical.

7. Memory apparatus comprising:
   a. a plurality of the memories as claimed in claim 1, 2, 4, 3, 5, or 6, arranged on chips into rows and/or columns and addressable by a further tree structure; and
   b. a plurality of further selection means acting as nodes in the further tree structure.

8. Memory apparatus comprising:
   a plurality of chips arranged in rows and/or columns, each chip comprising a memory which comprises:
   a. an array of memory elements, defining at least one coordinate direction, which elements are simultaneously addressable at random in subarrays defined by at least one respective range of addresses along the at least one coordinate direction;
   b. at least one selection means for addressing a subarray defined by at least one respective desired range of addresses in at least one respective on of the at least one coordinate direction, each selection means comprising:

i. respective input means for receiving upper and lower limit information defining said respective desired range;

ii. a respective plurality of similarly-operating selection modules, arranged as nodes connecting branches in a vertical tree structure having a plurality of levels, each module being responsive to a part of said upper and lower limit information, each module corresponding to a respective module range of addresses, with the respective module range of addresses being smaller for modules at lower levels of the tree and having:

A. a respective input for receiving an indication signal which provides a position indication for indicating a position of the part of the upper and lower limit information with respect to the respective module range of addresses, and B. a respective output means for supplying further indication signals such that in the modules at a lowest level of the tree structure the further indication signals are addressing signals for the memory elements in the subarray, and in the modules not at the lowest level of the tree structure the further indication signals are more specific position information for modules therebelow;

whereby, granularity of selection of the memory elements is arbitrarily low; and c. a further selection module coupled above the highest level in the tree structure; the chips being further arranged so that each of the further selection modules is a node in a further tree structure analogous to the tree structure of the individual selection means, and so that the further tree structure is obtained exclusively by external wiring together of the chips.

* * * * *